(12) United States Patent
Kim et al.

(10) Patent No.: US 7,091,594 B1
(45) Date of Patent: Aug. 15, 2006

(54) LEADFRAME TYPE SEMICONDUCTOR PACKAGE HAVING REDUCED INDUCTANCE AND ITS MANUFACTURING METHOD

(75) Inventors: Gi Jeong Kim, Kuri-shi (KR); Jin Han Kim, Namyangju-shi (KR); Jin Seok Oh, Gapyoung-gun (KR)

(73) Assignee: Amkor Technology, Inc., Chandler, AZ (US)

( * ) Notice: Subject to any disclaimer, the term of this patent is extended or adjusted under 35 U.S.C. 154(b) by 219 days.

(21) Appl. No.: 10/766,046

(22) Filed: Jan. 28, 2004

(51) Int. Cl.
*H01L 23/22* (2006.01)

(52) U.S. Cl. .................................................. 257/687
(58) Field of Classification Search ................ 257/783, 257/778, 777, 712, 692, 687
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |

(Continued)

FOREIGN PATENT DOCUMENTS

DE  19734794 A1  8/1997

(Continued)

*Primary Examiner*—Carl Whitehead, Jr.
*Assistant Examiner*—Monica D. Harrison
(74) *Attorney, Agent, or Firm*—Stetina Brunda Garred & Brucker (57) ABSTRACT

A semiconductor die comprising a heat sink having opposed top and bottom surfaces and defining a peripheral edge. Attached to the top surface of the heat sink is a semiconductor die. Extending at least partially about the semiconductor die is a plurality of leads, at least some of which are electrically connected to the semiconductor die. Attached to the top surface of the heat sink between the semiconductor die and the peripheral edge thereof is at least one first ground lead. Also attached to the top surface of the heat sink and protruding beyond the peripheral edge thereof is at least one second ground lead. A plurality of ground wires conductively connect the semiconductor die, the first and second ground leads and the heat sink to each other. A package body at least partially encapsulates the heat sink, the semiconductor die, the leads, the first and second ground leads, and the ground wires such that at least portions of the second ground leads and the leads protrude from the package body.

20 Claims, 6 Drawing Sheets

U.S. PATENT DOCUMENTS

| | | |
|---|---|---|
| 4,942,454 A | 7/1990 | Mori et al. |
| 4,987,475 A | 1/1991 | Schlesinger et al. |
| 5,018,003 A | 5/1991 | Yasunaga |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,485,037 A * | 1/1996 | Marrs .................. 257/712 |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |

| | | |
|---|---|---|
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,473 A | 9/2000 | Costantini et al. |
| 6,114,752 A | 9/2000 | Huang et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,367 B1 | 5/2001 | Hsuan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karmezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,369,447 B1 | 4/2002 | Mori |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,410,979 B1 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B1 | 9/2002 | Shimoda |
| 6,459,148 B1 | 10/2002 | Chun-Jen et al. |
| 6,464,121 B1 | 10/2002 | Reijnders |
| 6,476,469 B1 | 11/2002 | Huang et al. |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B1 | 12/2002 | Azuma |
| 6,507,096 B1 | 1/2003 | Gang |
| 6,507,120 B1 | 1/2003 | Lo et al. |
| 6,534,849 B1 | 3/2003 | Gang |
| 6,545,332 B1 | 4/2003 | Huang |
| 6,545,345 B1 | 4/2003 | Glenn et al. |
| 6,559,525 B1 | 5/2003 | Huang |
| 6,566,168 B1 | 5/2003 | Gang |
| 6,583,503 B1 | 6/2003 | Akram et al. |
| 6,603,196 B1 | 8/2003 | Lee et al. |
| 6,624,005 B1 | 9/2003 | Di Caprio et al. |
| 6,667,546 B1 | 12/2003 | Huang et al. |
| 2001/0008305 A1 | 7/2001 | McLellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0140061 A1 | 10/2002 | Lee |
| 2002/0140068 A1 | 10/2002 | Lee et al. |
| 2002/0163015 A1 | 11/2002 | Lee et al. |
| 2003/0030131 A1 | 2/2003 | Lee et al. |
| 2003/0073265 A1 | 4/2003 | Hu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |
| 2004/0065963 A1 | 4/2004 | Karnezos |

FOREIGN PATENT DOCUMENTS

| | | |
|---|---|---|
| EP | 5421117 | 6/1979 |
| EP | 5950939 | 3/1984 |
| EP | 0393997 | 10/1990 |
| EP | 0459493 | 12/1991 |
| EP | 0720225 | 3/1996 |
| EP | 0720234 | 3/1996 |
| EP | 0794572 A2 | 10/1997 |
| EP | 0844665 | 5/1998 |
| EP | 0936671 | 8/1999 |

| | | | | | | |
|---|---|---|---|---|---|---|
| EP | 098968 | 3/2000 | | JP | 6140563 | 5/1994 |
| EP | 1032037 | 8/2000 | | JP | 6260532 | 9/1994 |
| JP | 55163868 | 12/1980 | | JP | 7297344 | 11/1995 |
| JP | 5745959 | 3/1982 | | JP | 7312405 | 11/1995 |
| JP | 58160095 | 8/1983 | | JP | 864634 | 3/1996 |
| JP | 59208756 | 11/1984 | | JP | 8083877 | 3/1996 |
| JP | 59227143 | 12/1984 | | JP | 8125066 | 5/1996 |
| JP | 60010756 | 1/1985 | | JP | 8222682 | 8/1996 |
| JP | 60116239 | 8/1985 | | JP | 8306853 | 11/1996 |
| JP | 60195957 | 10/1985 | | JP | 98205 | 1/1997 |
| JP | 60231349 | 11/1985 | | JP | 98206 | 1/1997 |
| JP | 6139555 | 2/1986 | | JP | 98207 | 1/1997 |
| JP | 629639 | 1/1987 | | JP | 992775 | 4/1997 |
| JP | 6333854 | 2/1988 | | JP | 9293822 | 11/1997 |
| JP | 63067762 | 3/1988 | | JP | 10022447 | 1/1998 |
| JP | 63188964 | 8/1988 | | JP | 10163401 | 6/1998 |
| JP | 63205935 | 8/1988 | | JP | 10199934 | 7/1998 |
| JP | 63233555 | 9/1988 | | JP | 10256240 | 9/1998 |
| JP | 63249345 | 10/1988 | | JP | 00150765 | 5/2000 |
| JP | 63289951 | 11/1988 | | JP | 556398 | 10/2000 |
| JP | 63316470 | 12/1988 | | JP | 2001060648 | 3/2001 |
| JP | 64054749 | 3/1989 | | JP | 200204397 | 8/2002 |
| JP | 1106456 | 4/1989 | | KR | 941979 | 1/1994 |
| JP | 1175250 | 7/1989 | | KR | 199541844 | 11/1995 |
| JP | 1205544 | 8/1989 | | KR | 199544554 | 11/1995 |
| JP | 1251747 | 10/1989 | | KR | 199674111 | 12/1996 |
| JP | 2129948 | 5/1990 | | KR | 9772358 | 11/1997 |
| JP | 369248 | 7/1991 | | KR | 100220154 | 6/1999 |
| JP | 3177060 | 8/1991 | | KR | 200072714 | 12/2000 |
| JP | 4098864 | 9/1992 | | KR | 0049944 | 6/2002 |
| JP | 5129473 | 5/1993 | | WO | 9956316 | 11/1999 |
| JP | 5166992 | 7/1993 | | WO | 9967821 | 12/1999 |
| JP | 5283460 | 10/1993 | | | | |
| JP | 692076 | 4/1994 | | * cited by examiner | | |

LEADFRAME TYPE SEMICONDUCTOR PACKAGE HAVING REDUCED INDUCTANCE AND ITS MANUFACTURING METHOD

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor packages, and more particularly to a semiconductor package having reduced inductance, and a method of manufacturing such semiconductor package.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads or terminals on the semiconductor die to individual leads of the leadframe, and a hard plastic encapsulant material which covers the other components and forms the exterior of the semiconductor package commonly referred to as the package body.

The leadframe is the central supporting structure of a semiconductor package. In many semiconductor package designs, that portion of the leadframe to which the semiconductor die is bonded effectively functions as and is commonly referred to as a heat sink. In most semiconductor package configurations, a portion of the leadframe is internal to the package, (i.e., completely surrounded by the package body). Portions of the leads of the leadframe typically extend externally from the package body or are partially exposed therein for use in electrically connecting the package to another component. Similarly, at least a portion of the heat sink is exposed in the package body to discharge heat generated by the semiconductor die. The heat sink of the leadframe is also often referred to as a die pad.

In the electronics industry, there is continued development of semiconductor dies which have increasing processing speeds and higher degrees of integration. For a semiconductor package to accommodate these enhanced semiconductor dies, the number of leads included in the semiconductor package must be significantly increased. To avoid an undesirable increase in the size of the semiconductor package attributable to the increased number of leads, a common practice is to reduce or narrow the lead pitch. However, a result of the narrowing of the lead pitch is an increase in the level of self inductance and mutual inductance (hereinafter collectively referred to as "inductance") generated from the leads of the semiconductor package. Thus, leadframe type semiconductor packages are typically considered to be unsuitable for semiconductor dies which transmit signals at high speed since the relatively high inductance of such semiconductor packages may distort the signals transmitted from such high speed semiconductor dies. In this regard, many mobile communication devices (e.g., cellular phones) and personal communication devices which are equipped with semiconductor dies capable of transmitting high-frequency signals typically are outfitted with BGA (ball grid array) semiconductor packages which accommodate such semiconductor dies. If such semiconductor dies were to be installed or packaged in a leadframe type semiconductor package, significant signal loss may be created due to the inductance problem described above.

In recognition of this problem and the need to change the structure of leadframe type semiconductor packages to accommodate semiconductor dies which transmit signals at high speeds, there has been developed in the prior art a leadframe type semiconductor package wherein a semiconductor die and a ground lead are each bonded to a heat sink or die pad through the use of conductive wires, thereby reducing inductance with respect to the ground lead. However, the effective reduction in inductance achieved in this type of semiconductor package is not significant since only a narrow area of the heat sink or die pad bonded to the conductive wire acts a ground, with the remaining area of the heat sink or die pad not acting as a ground. These deficiencies are addressed and overcome by the semiconductor package constructed in accordance with the present invention, as will be described in more detail below.

BRIEF SUMMARY OF THE INVENTION

In accordance with the present invention, there is provided a leadframe type semiconductor package which is specifically configured to provide significant inductance reduction when used to accommodate a semiconductor die capable of transmitting high-frequency signals at high speed. To facilitate such inductance reduction, the leadframe of the semiconductor package of the present invention includes first and second ground leads which are attached to the top surface of a heat sink and segregated into pairs. The first and second ground leads of each pair are arranged in aligned, spaced relation to each other, and are disposed between a corresponding adjacent pair of the signal or power leads of the semiconductor package. The semiconductor die, the first and second ground leads of each pair, and the heat sink are conductively connected to each other through the use of multiple ground wires. Thus, in the semiconductor package of the present invention, the heat sink rapidly discharges heat generated from the semiconductor die, while acting as an enlarged ground area, thus reducing package inductance and improving the electrical performance of the semiconductor die.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
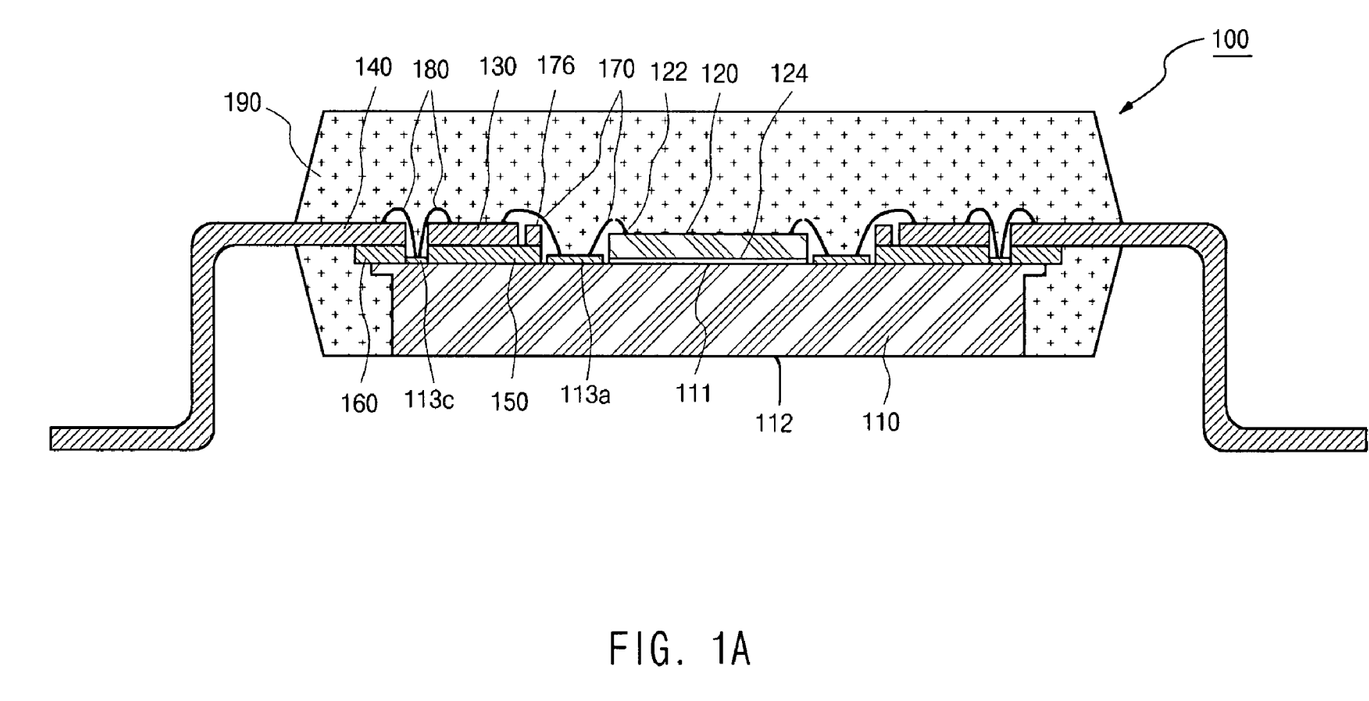
FIG. 1A is a cross-sectional view of a semiconductor package constructed in accordance with a first embodiment of the present invention.
Figure 1B:
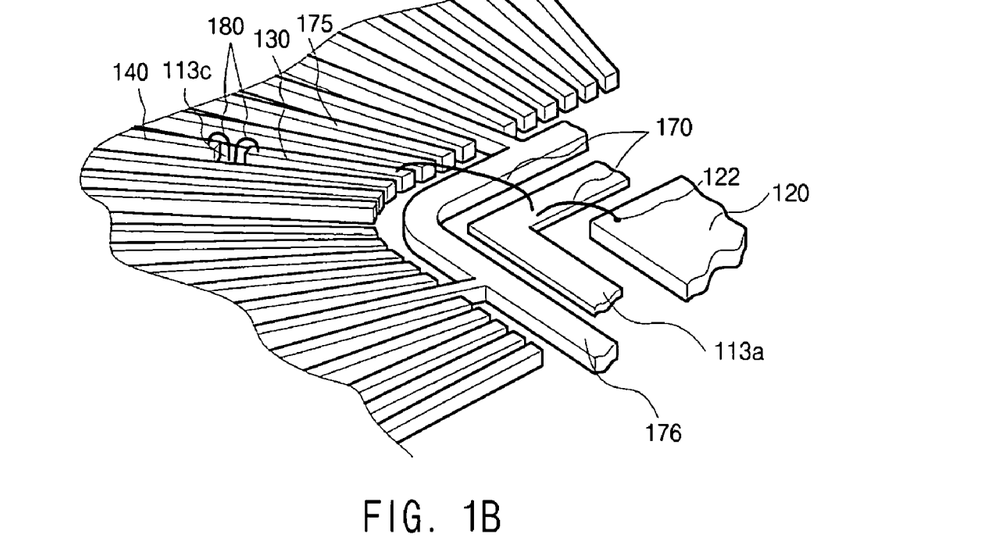
FIG. 1B is a partial perspective view of the semiconductor package shown in FIG. 1A, with a portion of the package body of the semiconductor package being removed.
Figure 1C:
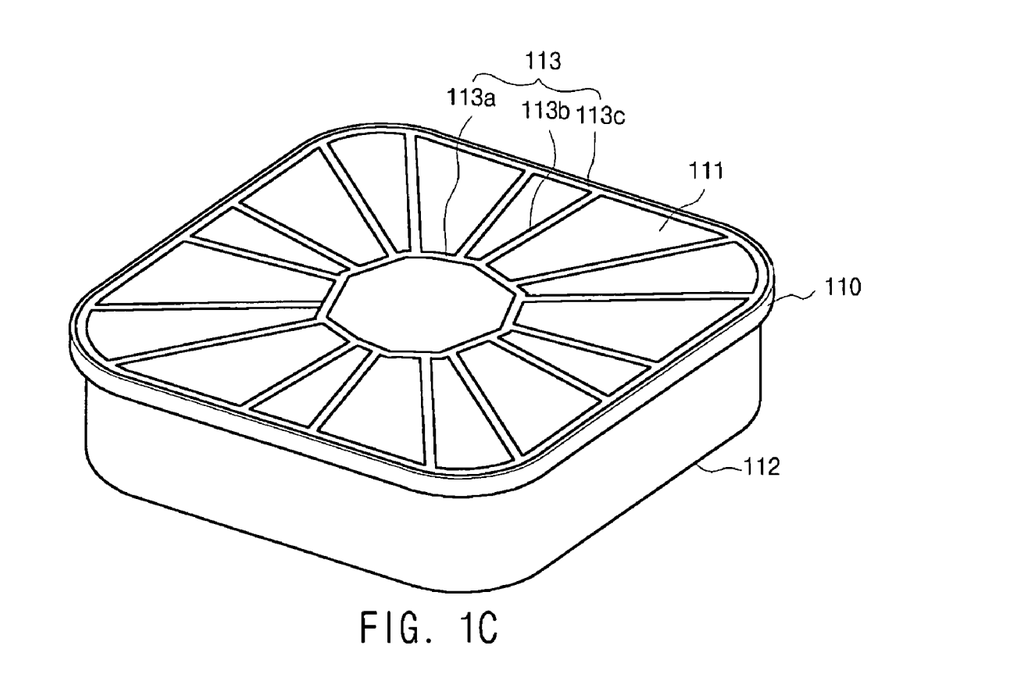
FIG. 1C is a top perspective view of the heat sink of the semiconductor package shown in FIG. 1A.

Referring now to the drawings wherein the showings are for purposes of illustrating preferred embodiments of the present application only, and not for purposes of limiting the same, FIGS. 1A–1C illustrate a semiconductor package 100 constructed in accordance with a first embodiment of the present invention. The semiconductor package 100 comprises a leadframe having a die pad or heat sink 110. The heat sink 110 includes a generally planar first (top) surface 111 and an opposed, generally planar second (bottom) surface 112. As best seen in FIGS. 1A and 1C, the area of the top surface 111 exceeds that of the bottom surface 112. In this regard, the heat sink 110 defines a continuous shelf which is disposed in opposed relation to the top surface 111 and circumvents the bottom surface 112. More particularly, the shelf is perpendicularly recessed relative to the bottom surface 112. The recessed shelf is used to increase the bonding or adhesion force between the package body of the semiconductor package 100 and the heat sink 110, as will be discussed in more detail below. The heat sink 110 preferably has a generally quadrangular shape (e.g., square) defining four sides or peripheral edge segments, and hence four corner regions.

As seen in FIGS. 1A–1C, disposed on the top surface 111 of the heat sink 110 is a plating section 113. The plating section 113 includes a first plating region 113a which has a ring-like shape and is disposed in the central portion of the top surface 111 of the heat sink 110. In addition to the first region 113a, the plating section 113 includes a plurality of second regions 113b which are integrally connected to and extend linearly or radially from the first section 113a. The distal ends of the second regions 113b are integrally connected to a continuous third region 113c of the plating section 113. As best seen in FIG. 1C, the third region 113c of the plating section 113 extends along and in close proximity to the peripheral edge of the top surface 111 of the heat sink 110. In the plating section 113, the second regions 113b improve a skin effect, i.e., a surface electronic mobility between the first region 113a and the third region 113c.

In the semiconductor package 100, it is contemplated that the heat sink 110 of the leadframe will be made of copper, aluminum, or a similar material. However, those of ordinary skill in the art will recognize that the present invention is not limited to any particular material for the heat sink 110, or the specific shapes of the first and third plating regions 113a, 113c as shown in FIG. 1C. Nor is the present invention limited to the specific number of second regions 113b shown in FIG. 1C. It is further contemplated that the plating section 113 will be fabricated from the application of silver or a similar, suitable conductive material to the top surface 111 of the heat sink 110.

In the semiconductor package 100, a semiconductor die 120 is bonded to the top surface 111 of the heat sink 110 within the first region 113a of the plating section 113, i.e., the first region 113a circumvents the semiconductor die 120.

The attachment of the semiconductor die 120 to the top surface 111 of the heat sink 110 is preferably accomplished through the use of a layer 124 of a suitable adhesive. Included on the upper surface of the semiconductor die 120 is a plurality of terminals or bond pads 122.

In addition to the heat sink 110, the leadframe of the semiconductor package 100 includes at least one first ground lead 130 which is bonded to the top surface 111 of the heat sink 110. The attachment of the first ground lead 130 to the top surface 111 is preferably facilitated by a first insulating layer 150. As best seen in FIG. 1A, the first ground lead 130 is positioned, in its entirety, inwardly of the peripheral edge of the top surface 111, i.e., no portion of the first ground lead 130 protrudes beyond the peripheral edge of the top surface 111. It is contemplated that the first insulating layer 150 used to secure the first ground lead 130 to the top surface 111 may be positioned above one of the second regions 113b of the plating section 113.

In addition to the first ground lead 130, the leadframe of the semiconductor package 100 includes at least one second ground lead 140 which, like the first ground lead 130, is also bonded to the top surface 111 of the heat sink 110. The attachment of the second ground lead 140 to the top surface 111 is preferably facilitated by a second insulating layer 160. However, the length of the second ground lead 140 substantially exceeds that of the first ground lead 130, with only an inner end portion of the second ground lead 140 extending to the inner end thereof being positioned over the top surface 111 of the heat sink 110. In this regard, as is best seen in FIG. 1A, the majority of the length of the second ground lead 140 protrudes outwardly beyond the peripheral edge 111 of the heat sink 110. As is best seen in FIG. 1B, the first and second ground leads 130, 140 are preferably oriented relative to each other such that the outer end of the first ground lead 130, (i.e., the end disposed furthest from the semiconductor die 120) is located in close proximity to, but spaced from the inner end of the second ground lead 140, the first and second ground leads 130, 140 extending in substantially aligned relation to each other. The first and second ground leads 130, 140 are also oriented relative to the plating section 113 such that the third region 113c extends in the gap defined between the outer end of the first ground lead 130 and the inner end of the second ground lead 140, in the manner best shown in FIG. 1A. It is contemplated that a portion of one second region 113b of the plating section 113 and/or a portion of the third region 113c of the plating section 113 may be positioned below the second insulating layer 160 used to attach the second ground lead 140 to the heat sink 110.

The first and second insulating layers 150, 160 described above preferably each comprise a segment of a polyimide tape. However, those of ordinary skill in the art will recognize that the present invention is not limited to any particular material for the first and second insulating layers 150, 160. Additionally, it is contemplated that the first and second ground leads 130, 140 will each be fabricated from copper, a copper alloy, or another suitable conductive material, though the present invention is not limited to any particular material for the first and second ground leads 130, 140.

In addition to the first and second ground leads 130, 140, the leadframe of the semiconductor package 100 comprises a plurality of signal leads (or power leads) 175. The signal leads 175 extend in spaced relation to each other, and are preferably arranged to circumvent the semiconductor die 120. As best seen in FIG. 1B, the aligned first and second ground leads 130, 140 extend between an adjacent pair of the signal leads 175. Though only one aligned pair of first and second ground leads 130, 140 is shown in FIG. 1B, those of ordinary skill in the art will recognize that the leadframe of the semiconductor package 100 may be outfitted with additional aligned pairs of first and second ground leads 130, 140 which are located between other adjacent pairs of the signal leads 175 in the leadframe. It is further contemplated that the leadframe of the semiconductor package 100 may also include a ground ring or a power ring 176 which is positioned between the semiconductor die 120 and the first ground lead 130. Assuming that multiple pairs of the first and second ground leads 130, 140 are included in the leadframe, it is contemplated that the ring 176 will be positioned on the first insulating layers 150 used to attach the first ground leads 130 to the top surface 111, in the manner shown in FIG. 1A.

In the semiconductor package 100, a first pair of ground wires 170 and a second pair of ground wires 180 is used to facilitate desired conductive connections between the semiconductor die 120, plating section 113, and first and second ground leads 130, 140. More particularly, as seen in FIGS. 1A and 1B, a first ground wire 170 of the first set is used to connect one of the bond pads 122 of the semiconductor die 120 to the first region 113a of the plating section 113, with a second ground wire 170 of the first set being used to connect the first region 113a to the first ground lead 130. Thus, the ground wires 170 of the first set effectively connect the semiconductor die 120 to the first ground lead 130 via the first region 113a of the plating section 113. Thus, a ground signal of the semiconductor die 120 is transferred or transmitted to the first ground lead 130 by way of the ground wires 170 and heat sink 110.

As is further seen in FIGS. 1A and 1B, a first ground wire 180 of the second set is used to connect the first ground lead 130 to the third region 113c of the plating section 113. A second ground wire 180 of the second set is used to connect the second ground lead 140 to the third region 113c of the plating section 113. Thus, the ground signal generated from the semiconductor 120, in addition to being transferred to the first ground lead 130, is also transferred or transmitted to the second ground lead 140. That is, the ground signal of the semiconductor die 120 is transferred to the heat sink 110 and the first ground lead 130 through the ground wires 170 of the first set, and is transferred to the second ground lead 140 through the ground wires 180 of the second set. Further, the ground signal transferred to the first region 113a of the heat sink 110 is transferred to the third region 113c via the second regions 113b and is thus transferred to the second ground lead 140 by the ground wire 180 which extends from the third region 113c to the second ground lead 140.

Based on the foregoing, the ground signal of the semiconductor die 120 is transferred to an external device by way of the ground wires 170 of the first set, the first ground lead 130, the ground wires 180 of the second set, and the second ground lead 140. However, the ground signal of the semiconductor die 120 can also be transferred to the external device through the heat sink 110 which is overlapped with the first ground lead 130, the first region 113a, the second region 113b, and the third region 113c. Accordingly, both the first ground lead 130 and heat sink 110 can be used as a ground plane, thereby increasing ground effect. Thus, in accordance with the present invention, inductance of the leads 175 positioned adjacent to the first ground lead 130 is significantly reduced. The reason for such significant reduction is that not only is the ground signal transferred to the second ground lead 140 through the ground wires 170 of the first set, the first ground lead 130, and the ground wires 180 of the second set, but is also transferred to the first, second and third plating regions 113a, 113b, 113c and the second ground lead 140 by one of the ground wires 170 and one of the ground wires 180. The ground wires 170, 180 of the first and second sets may be fabricated from gold, aluminum, copper or similar conductive materials, though the present invention is not limited to any particular material for the first and second ground wires 170, 180.

It is contemplated that in the semiconductor package 100, the ground wire 170 extending between the first ground lead 130 and first region 113a can be omitted. Similarly, the ground wire 180 of the second set extending between the first ground lead 130 and third region 113c can be omitted.

The semiconductor package 100 of the first embodiment further comprises a package body 190 which at least partially covers or encapsulates the heat sink 110, the semiconductor die 120, the first and second ground leads 130, 140, the first and second ground wires 170, 180 and the signal leads 175. However, as is seen in FIG. 1A, substantial portions of the second ground leads 140 and signal leads 175 protrude from the side surface of the package body 190, so as to be easily connectible to an external device. In addition, the thickness of the heat sink 110 is substantially greater than the thickness of each of the first and second ground leads 130, 140, so that the bottom surface 112 of the heat sink 110 is exposed in and substantially flush with a bottom exterior surface of the package body 190. Thus, heat generated by the semiconductor die 120 and the leads 175 may be easily discharged to the exterior of the semiconductor package 100 through the heat sink 110. Thus, in the semiconductor package 100, the hest sink 110 rapidly discharges heat generated from the semiconductor die 120 while acting an enlarged ground area, thus reducing package inductance and improving the electrical performance of the semiconductor die 120. The covering of the recessed shelf of the heat sink 110 with the package body 190 effectively locks the heat sink 110 to the package body 190.

Figure 3A:
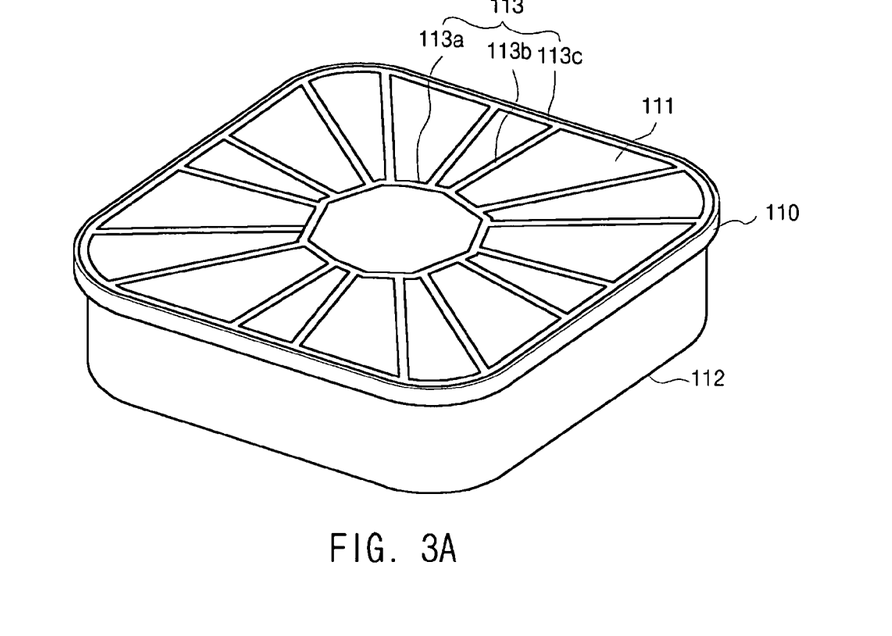
FIGS. 3A–3E illustrate an exemplary sequence of steps which may be used to facilitate the fabrication of the semiconductor package of the first embodiment shown in FIGS. 1A–1C.
Figure 3B:
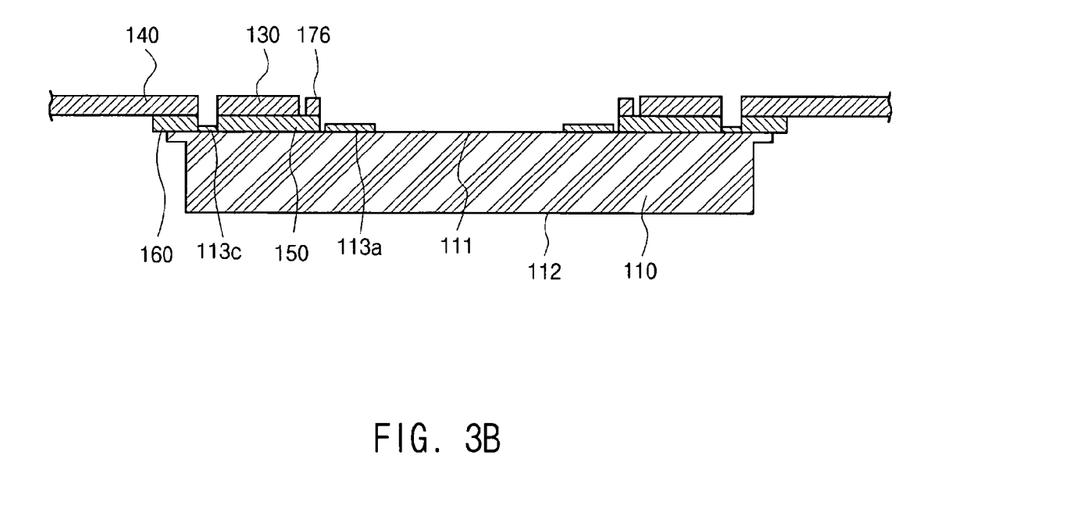

Referring now to FIGS. 3A–3E, there is shown an exemplary sequence of steps which may be used to facilitate the fabrication of the semiconductor package 100 of the first embodiment of the present invention. The initial step of the fabrication method comprises providing the heat sink 110 having the above-described structural attributes and including the above-described plating section 113 applied to the top surface 111 (FIG. 3A). Thereafter, multiple first ground leads 130 and multiple second ground leads 140 are bonded to the top surface 111 of the heat sink 110 through the use of the first and second insulating layers 150, 160 in the above-described orientations (FIG. 3B). As indicated above, the first and second ground leads 130, 140 are oriented relative to the plating section 113 such that the first region 113a is disposed inward of the inner ends of the first ground leads 130, with the third region 113c extending and being exposed between the outer ends of the first ground leads 130 and the inner ends of the second ground leads 140. It is contemplated that each pair of first and second ground leads 130, 140 may be formed by initially bonding a single lead to the top surface 111 of the heat sink 110, and thereafter punch-cutting such lead in a manner effectively forming the separate first and second ground leads 130, 140. A portion of the single insulating layer which would be used to attach such single lead to the top surface 111 would also be removed such that the third region 113c of the plating section 113 is exposed between the first and second ground leads 130, 140 formed by the cutting of the single lead as described above. At the time each pair of first and second ground leads 130, 140 is attached to the heat sink 110 in the above-described manner, such pairs of first and second ground leads 130, 140 are already positioned between adjacent pairs of the leads 175, though such leads 175 are not shown in FIG. 3B. However, the above-described ring 176 of the leadframe of the semiconductor package 100 which is actually integrally connected to certain ones of the leads 175 as shown in FIG. 1B is depicted in FIG. 3B. Thus, at the time each pair of first and second ground leads 130, 140 is attached to the heat sink 110, the leads 175 and ring 176 (if included in the leadframe) are also cooperatively interfaced to the heat sink 110 in the above-described orientations.

Figure 3C:
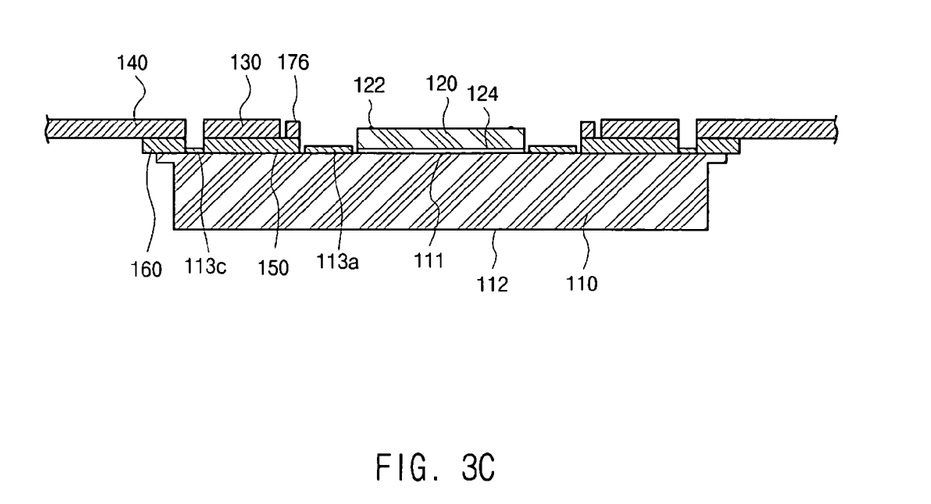

In the next step of the preferred assembly method, the semiconductor die is bonded to the top surface 111 of the heat sink 110 within the first region 113a through the use of the adhesive layer 124 (FIG. 3C). It is not necessarily required to locate the semiconductor die 120 in the center of the heat sink 110 within the first region 113a of the plating section 113. In this regard, a portion of the semiconductor die 120 may be positioned over a portion of the first region 113a.

Figure 3D:
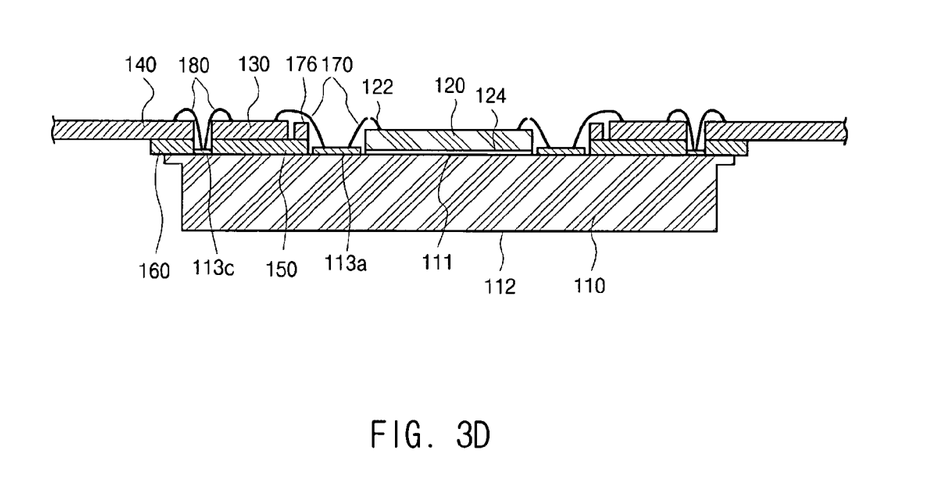

Subsequent to the attachment of the semiconductor die 120 to the heat sink 110, the ground wires 170, 180 are extended between bond pads 122 of the semiconductor die 120, the plating section 113, and the first and second ground leads 130, 140 of each pair in the above-described manner so as to facilitate the desired pattern of conductive connections between such components (FIG. 3D). This pattern of conductive connections provides the inductance reduction advantages described above. During the process of adding the first and second ground wires 170, 180 to the semiconductor package 100, other bond pads 122 of the semiconductor die 120 are wire-bonded to the leads 175.

Figure 3E:
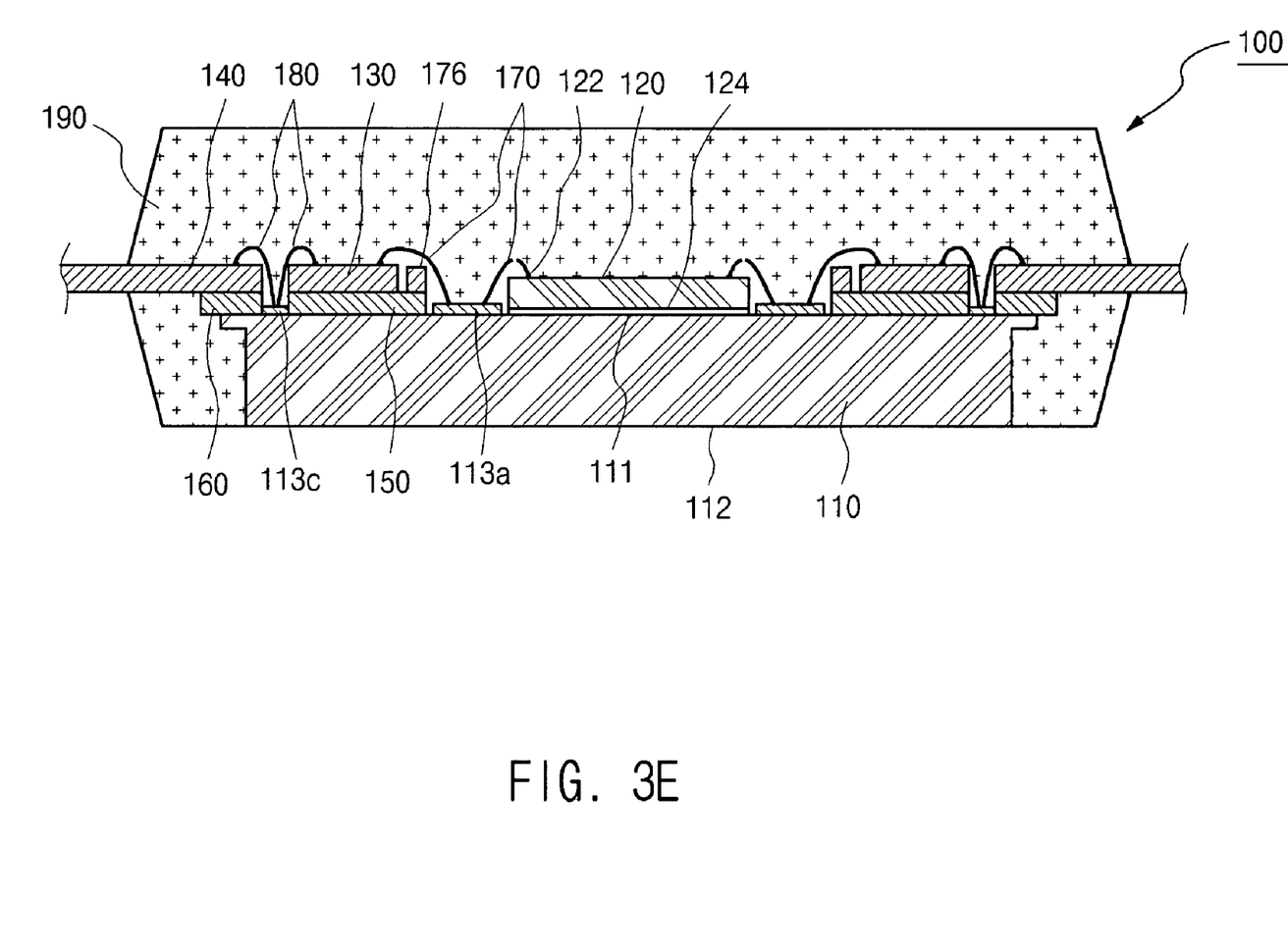

Subsequent to the conductive connection of the semiconductor die 120 to the leads 175 and first and second ground leads 130, 140 of each pair in the above-described manner, an encapsulant material is applied to the semiconductor die 120, heat sink 110, first and second ground leads 130, 140 of each pair, the first and second ground wires 170, 180 and leads 175, as well as the wire bonds extending between the semiconductor die 120 and leads 175 (FIG. 3E). The hardening of the encapsulant material facilitates the formation of the package body 190 of the semiconductor package 100. In the fully formed semiconductor package 100, the bottom surface 112 of the heat sink 110 is exposed in and substantially flush with the bottom exterior surface of the package body 190.

Figure 2:
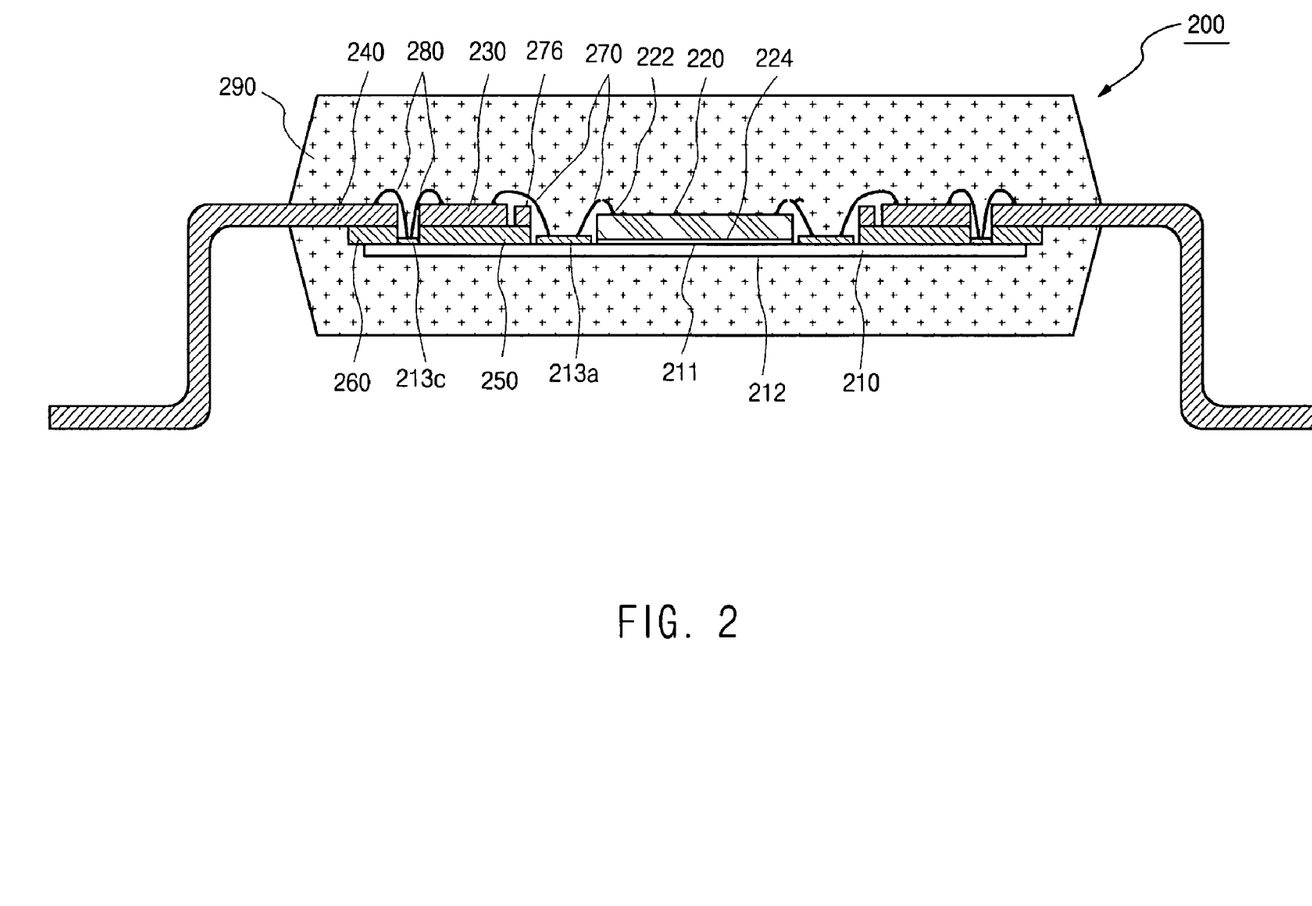
FIG. 2 is a cross-sectional view of a semiconductor package constructed in accordance with a second embodiment of the present invention.

Referring now to FIG. 2, there is shown a semiconductor package 200 constructed in accordance with a second embodiment of the present invention. In FIG. 2, the 200 series reference numerals are used to identify elements corresponding to those identified with the 100 series reference numerals in FIGS. 1A–1C. The major distinction between the semiconductor packages 100, 200 lies in the configuration of the heat sink 210 of the semiconductor package 200 in comparison to the heat sink 110 of the semiconductor package 100. More particularly, in the semiconductor package 200, the thickness of the heat sink 210 is substantially identical to or less than the thickness of each of the first and second ground leads 230, 240. In this regard, the heat sink 210 is made of a material identical to that of the first and second ground leads 230, 240, and is actually formed concurrently with the formation of the first and second ground leads 230, 240. Due to its reduced thickness, the heat sink 210 is completely covered by the package body 290, with no portion of the bottom surface 212 of the heat sink 210 being exposed in the package body 290. Though the heat sink 210 does not dissipate heat in the same manner as does the heat sink 110, the heat sink 210 still functions to discharge heat to the exterior of the semiconductor package 200 through the first and second ground leads 230, 240 of each pair, as well as the signal leads or power leads of the semiconductor package 200. The heat sink 210 still acts as a ground plane when the semiconductor die 220 is operated, thereby reducing inductance. As will be recognized, the manufacturing method for the semiconductor package 200 is substantially the same as that described above in relation to the semiconductor package 100, except that the encapsulant material which hardens into the package body 290 is applied to the heat sink 210 in a manner completely covering the same such that no portion of the heat sink 210 is exposed in the package body 290.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one of skill in the art in view of this disclosure.

What is claimed is:

1. A semiconductor package comprising:
   a heat sink having opposed top and bottom surfaces and defining a peripheral edge;
   a semiconductor die attached to the top surface of the heat sink;
   a plurality of leads extending at least partially about the semiconductor die, the semiconductor die being electrically connected to at least one of the leads;
   at least one first ground lead attached to the top surface of the heat sink between the semiconductor die and the peripheral edge of the heat sink;
   at least one second ground lead attached to the top surface of the heat sink and protruding beyond the peripheral edge thereof;
   a plurality of ground wires conductively connecting the semiconductor die, the first and second ground leads, and the heat sink to each other; and
   a package body at least partially encapsulating the heat sink, the semiconductor die, the leads, the first and second ground leads, and the ground wires such that at least portions of the second ground lead and the leads are exposed in the package body.

2. The semiconductor package of claim 1 wherein:
   the first ground lead is secured to the top surface of the heat sink by a first insulating layer; and
   the second ground lead is secured to the top surface of the heat sink by a second insulating layer.

3. The semiconductor package of claim 2 wherein the first and second insulating layers are each fabricated from a polyimide tape.

4. The semiconductor package of claim 1 wherein:
   a plurality of first ground leads is attached to the top surface of the heat sink;
   a plurality of second ground leads is attached to the top surface of the heat sink;
   the first and second ground leads are segregated into pairs, with the first and second ground leads of each pair being arranged in aligned, spaced relation to each other; and
   the first and second ground leads of each pair are disposed between a corresponding adjacent pair of the leads.

5. The semiconductor package of claim 4 wherein:
   a plating section is applied to the top surface of the heat sink;
   the semiconductor die is conductively connected to the plating section by at least one of the ground wires;

the first ground lead of each pair is conductively connected to the plating section by at least two of the ground wires; and the second ground lead of each pair is conductively connected to the plating section by at least one of the ground wires.

6. The semiconductor package of claim 5 wherein the plating section includes:

a first region which extends between the semiconductor package and the first ground lead of each set, the semiconductor die being conductively connected to the first region;

a third region which extends between the first and second ground leads of each set, the first ground lead being conductively connected to the first and third regions, with the second ground lead being conductively connected to the third region; and at least one second region which extends between and is integrally connected to the first and third regions.

7. The semiconductor package of claim 6 wherein the plating section includes a plurality of second regions which extend between the first and third regions thereof.

8. The semiconductor package of claim 1 wherein:

a plating section is applied to the top surface of the heat sink;

the semiconductor die is conductively connected to the plating section by at least one of the ground wires;

the first ground lead is conductively connected to the plating section by at least two of the ground wires; and the second ground lead is conductively connected to the plating section by at least one of ground wires.

9. The semiconductor package of claim 8 wherein:

the first and second ground leads are arranged in aligned, spaced relation to each other; and the plating section includes:

a first region which extends between the first ground lead and the semiconductor die, the semiconductor die being conductively connected to the first region;

a third region which extends between the first and second ground leads, the first ground lead being conductively connected to the first and third regions, with the second ground lead being conductively connected to the third region; and at least one second region which is integrally connected to and extends between the first and third regions.

10. The semiconductor package of claim 9 wherein the plating section includes a plurality of second regions which extend between the first and third regions thereof.

11. The semiconductor package of claim 9 wherein the first region of the plating section circumvents the semiconductor die.

12. The semiconductor package of claim 1 wherein the bottom surface of the heat sink is exposed in the package body.

13. The semiconductor package of claim 12 wherein the bottom surface of the heat sink is generally planar and is substantially flush with a generally planar exterior surface of the package body.

14. The semiconductor package of claim 1 further comprising a ring extending between the first ground lead and the semiconductor die.

15. A semiconductor package comprising:

a heat sink having opposed top and bottom surfaces and defining a peripheral edge;

a semiconductor die attached to the top surface of the heat sink;

at least one first ground lead attached to the top surface of the heat sink in spaced relation to the semiconductor die;

at least one second ground lead attached to the top surface of the heat sink in spaced relation to the first ground lead;

a plurality of ground wires conductively connecting the semiconductor die, the first and second ground leads, and the heat sink to each other; and a package body at least partially encapsulating the heat sink, the semiconductor die, the first and second ground leads, and the ground wires such that at least a portion of the second ground lead is exposed in the package body and no portion of the first ground lead is exposed in the package body.

16. The semiconductor package of claim 15 further comprising:

a plurality of leads extending at least partially about the semiconductor die;

the semiconductor die being electrically connected to at least one of the leads.

17. The semiconductor package of claim 16 wherein:

a plurality of first ground leads is attached to the top surface of the heat sink;

a plurality of second ground leads is attached to the top surface of the heat sink;

the first and second ground leads are segregated into pairs, with the first and second ground leads of each pair being arranged in aligned, spaced relation to each other; and the first and second ground leads of each pair are disposed between a corresponding adjacent pair of the leads.

18. The semiconductor package of claim 17 wherein:

a plating section is applied to the top surface of the heat sink;

the semiconductor die is conductively connected to the plating section by at least one of the ground wires;

the first ground lead of each pair is conductively connected to the plating section by at least two of the ground wires; and the second ground lead of each pair is conductively connected to the plating section by at least one of the ground wires.

19. The semiconductor package of claim 15 wherein:

a plating section is applied to the top surface of the heat sink;

the semiconductor die is conductively connected to the plating section by at least one of the ground wires;

the first ground lead is conductively connected to the plating section by at least two of the ground wires; and the second ground lead is conductively connected to the plating section by at least one of the ground wires.

20. The semiconductor package of claim 19 wherein:

the first and second ground leads are arranged in aligned, spaced relation to each other; and the plating section includes:

a first region which extends between the first ground lead and the semiconductor die, the semiconductor die being conductively connected to the first region;

a third region which extends between the first and second ground leads, the first ground lead being conductively connected to the first and third regions, with the second ground lead being conductively connected to the third region; and at least one second region which is integrally connected to and extends between the first and third regions.

* * * * *